(12) United States Patent
Sasaki

(10) Patent No.: US 12,538,445 B2
(45) Date of Patent: Jan. 27, 2026

(54) COVER-EQUIPPED ELECTRONIC DEVICE

(71) Applicant: Alps Alpine Co., Ltd., Tokyo (JP)

(72) Inventor: Naoto Sasaki, Fukushima (JP)

(73) Assignee: ALPS ALPINE CO., LTD., Tokyo (JP)

( * ) Notice: Subject to any disclaimer, the term of this patent is extended or adjusted under 35 U.S.C. 154(b) by 221 days.

(21) Appl. No.: 18/366,482

(22) Filed: Aug. 7, 2023

(65) Prior Publication Data

US 2024/0074077 A1    Feb. 29, 2024

(30) Foreign Application Priority Data

Aug. 26, 2022   (JP) .................... 2022-135028

(51) Int. Cl.
| | |
|---|---|
| H05K 5/03 | (2006.01) |
| B60K 35/00 | (2024.01) |
| B60K 35/60 | (2024.01) |
| H05K 5/02 | (2006.01) |

(52) U.S. Cl.
CPC ............. *H05K 5/03* (2013.01); *H05K 5/0221* (2013.01); *H05K 5/0234* (2013.01); *B60K 35/00* (2013.01); *B60K 35/60* (2024.01); *B60K 2360/771* (2024.01)

(58) Field of Classification Search
None
See application file for complete search history.

(56) References Cited

U.S. PATENT DOCUMENTS

| | | | | |
|---|---|---|---|---|
| 9,535,457 | B1 * | 1/2017 | Vier | .................... B60R 11/02 |
| 2021/0243909 | A1 * | 8/2021 | Morita | .................. H05K 5/15 |

FOREIGN PATENT DOCUMENTS

| | | | |
|---|---|---|---|
| CN | 102323698 B | * | 12/2016 |
| DE | 39 29 768 A1 | | 3/1991 |
| JP | 08130382 A | * | 5/1996 |
| JP | H08130382 A | * | 5/1996 |
| WO | WO 2007/046789 A1 | | 4/2007 |

OTHER PUBLICATIONS

Machine translation Shimizu (JP 08130382 A) (Year: 1996).*
Extended European Search Report from EP 23189722.4, Jan. 30, 2024, 7 pp.

* cited by examiner

*Primary Examiner* — Allen L Parker
*Assistant Examiner* — Elisa Sasserath
(74) *Attorney, Agent, or Firm* — Crowell & Moring LLP

(57) ABSTRACT

A press-contact guide, a restraining guide, and a latching mechanism are provided between a housing of a device body and a cover. A restraining projection provided on the cover is inserted into an introduction opening to cause a press-contact projection to be pressed into contact with a press-contact slide part. In this state, the cover is slid in a latching-force-acting direction. Then, the cover moves with a restraining projection being restrained by the restraining guide and cause a projecting latch to latch into a receiving hole. When such a latched state is established, the cover and the housing go out of contact with each other at the press-contact guide and the restraining guide.

8 Claims, 16 Drawing Sheets

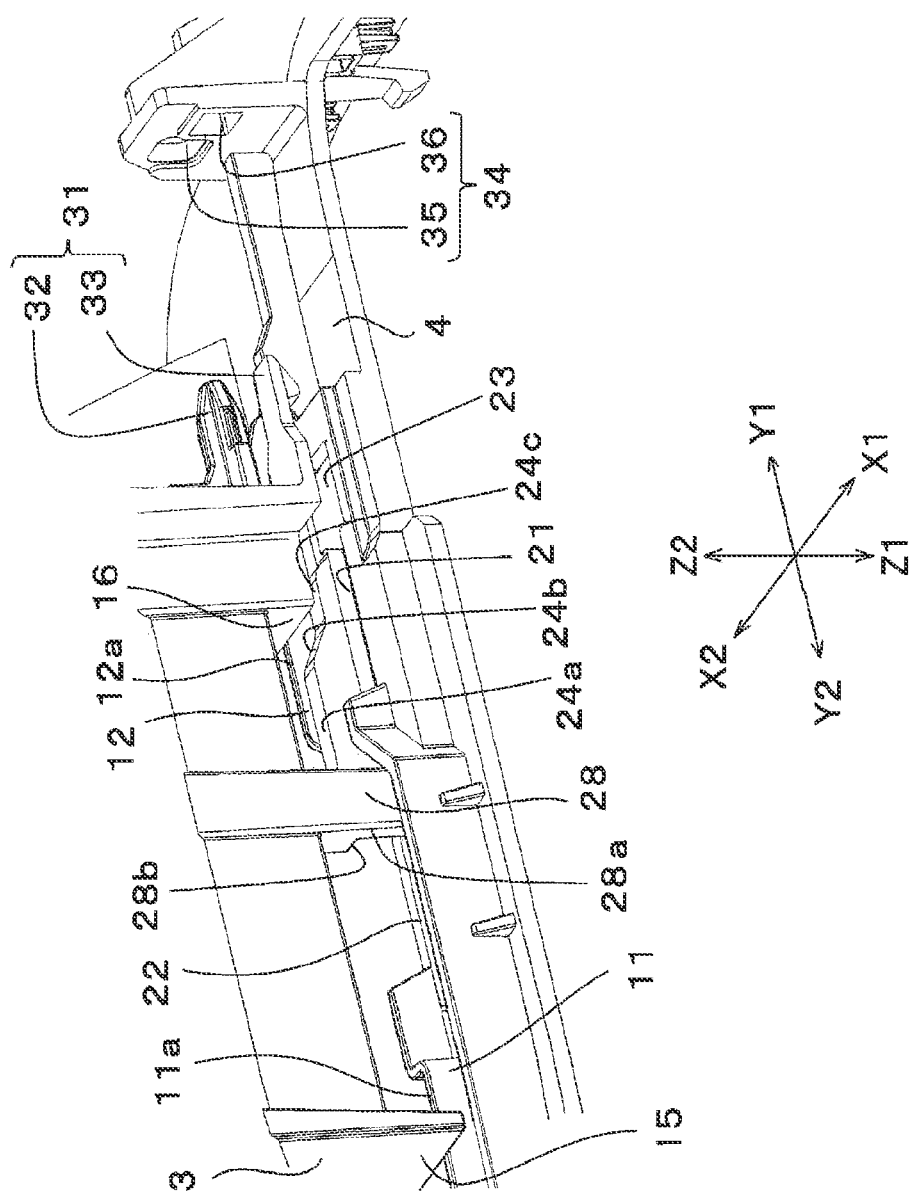

COVER-EQUIPPED ELECTRONIC DEVICE

RELATED APPLICATION

The present application claims priority to Japanese Patent Application No. 2022-135028, filed Aug. 26, 2022, the entirety of which is hereby incorporated by reference.

BACKGROUND

1. Field

The present disclosure relates to electronic devices having various electronic functions, such as onboard display devices, and particularly, to an electronic device equipped with a cover that is fastened to a device body by latching onto the device body.

2. Description of the Related Art

An electronic-device housing is disclosed by JP 8-130382 A, in which a cover is fastened to a case by latching onto the case. The case of this electronic-device housing is open upward and has two pairs of engaging ribs. The engaging ribs in each pair are provided on the inner side of opposite walls of the case and are located opposite each other. Each engaging rib is an elastic plate having a slide groove. The slide groove is open at one end of the engaging rib and is inclined upward, away from the case, toward the open side. The case has another engaging rib provided on one-end wall thereof extending orthogonally to the opposite walls. This engaging rib has two holes. On the other hand, the cover has two pairs of catches provided on the inner side of opposite walls thereof and in correspondence with the slide grooves. The catches have respective inclined surfaces that are at the same angle as the slide grooves. The cover further has two fitting protrusions provided on one-end wall thereof and in correspondence with the above-mentioned holes.

To attach the cover to the case, the fitting protrusions provided on the one-end wall of the cover are fitted into the respective holes provided in the one-end wall of the case, and the cover is rotated about the fitted part where the fitting protrusions are fitted into the holes and in such a manner as to be pushed toward the case. In this process, the catches of the cover slide along the outer surfaces of the engaging ribs of the case that have the slide grooves. When the cover is further pushed toward the case, the engaging ribs elastically deform to allow the catches to engage with the slide grooves. Thus, the cover is attached to the case.

SUMMARY

In the electronic-device housing disclosed by JP 8-130382 A, to attach the cover to the case, the fitting protrusions on the one-end wall of the cover first need to be positioned relative to the holes in the one-end wall of the case before being fitted into the holes. Such a positioning process is undesirable. Moreover, if the cover is to be attached to the back face of the case, and a worker therefore has to attach the cover without directly seeing the positions of the fitting protrusions and the holes, the above positioning and fitting process is particularly difficult.

In the electronic-device housing disclosed by JP 8-130382 A, after the cover is attached to the case, the cover and the case are fastened to each other with a screw. In contrast, suppose that a cover and a case are fitted to and retained to each other without using any screw, but only by engagement between fitting protrusions and holes, and between catches and slide grooves. Such a structure tends to have too many points of engagement between the cover and the case. Additionally, if such a structure is subjected to external vibrations, noise tends to be generated because of wobbling at the points of engagement.

The present disclosure solves the above problem in the known art, and provides a cover-equipped electronic device configured such that a cover is easily attachable to a device body and, after the cover is attached to the device body, noise due to wobbling is reduced with a minimal number of points of contact between the device body and the cover.

A cover-equipped electronic device according to the present disclosure includes a device body and a cover to be attached to the device body. One of the device body and the cover has a projecting latch, and the other of the device body and the cover has a receiving hole or a receiving recess that is to receive the projecting latch. The projecting latch is configured to latch into the receiving hole or the receiving recess to attach the cover to the device body when the cover is moved in a predetermined latching-force-acting direction. A restraining guide is provided between the device body and the cover and is configured to allow the cover to move in the latching-force-acting direction while restraining the cover in a direction intersecting the latching-force-acting direction. Restraint by the restraining guide is disabled when attaching of the cover to the device body is complete with the projecting latch latched into the receiving hole or the receiving recess.

In some embodiments, a press-contact guide may be provided between the device body and the cover, and may be configured to cause the device body and the cover to be pressed into contact with each other when the cover is pressed against the device body in the direction intersecting the latching-force-acting direction.

In some embodiments, restraint and guiding by the restraining guide may be started while the cover that is kept in contact with the device body at the press-contact guide is being moved in the latching-force-acting direction.

In some embodiments, the restraining guide includes a vertical restraining guide configured to guide the cover in the latching-force-acting direction while restraining the cover in a vertical direction from moving away from the device body, and an approach restraining guide configured to bring the cover moved in the latching-force-acting direction along the vertical restraining guide to a position close to the device body, where the projecting latch faces the receiving hole or the receiving recess, to be able to latch into the receiving hole or the receiving recess.

In some embodiments, the restraining guide may be configured to guide the cover while further restraining the cover in a horizontal direction that intersects both the vertical direction and the latching-force-acting direction.

The cover-equipped electronic device according to the present disclosure may be configured as follows. The restraining guide may have a restraining oblong hole and a restraining projection, the restraining oblong hole being provided in one of the cover and the device body, and the restraining projection being provided on the other of the cover and the device body, the restraining oblong hole being elongated in the latching-force-acting direction.

Furthermore, the restraining projection may be configured to move in the restraining oblong hole such that the cover is guided in the latching-force-acting direction while being restrained in a vertical direction from moving away from the device body, and while being further restrained in a horizontal direction that intersects both the vertical direction and the latching-force-acting direction.

In some embodiments, a press-contact guide may be provided between the device body and the cover, and may be configured to cause the device body and the cover to be pressed into contact with each other when the cover is pressed against the device body in the direction intersecting the latching-force-acting direction, to cause the restraining projection to be inserted into an introduction opening that is continuous with the restraining oblong hole.

Restraint and guiding by the restraining guide may be started while the cover that is kept in contact with the device body at the press-contact guide is being moved in the latching-force-acting direction.

In some embodiments, while the cover is being guided in the latching-force-acting direction with the restraining projection moving in the restraining oblong hole, the cover may be guided to a position close to the device body, where the projecting latch faces the receiving hole or the receiving recess, to be able to latch into the receiving hole or the receiving recess.

In some embodiments, the projecting latch may include a locking projection configured to lock the cover in a vertical direction in such a manner as to prevent the cover from moving away from the device body, and to further lock the cover in a horizontal direction intersecting both the vertical direction and the latching-force-acting direction, the locking projection locking the cover when being inserted into the receiving hole or the receiving recess. The latching projection may be configured to make the cover unmovable in the latching-force-acting direction.

In some embodiments, the device body may be installed on a ceiling of a cabin of a vehicle, and may include a display screen and an attaching mechanism, the display screen being provided at a front face of the device body, the attaching mechanism being provided at a back face of the device body and allowing the device body to be attached to the vehicle, the attaching mechanism being covered by the cover.

In some embodiments, to attach the cover to the device body, the cover is simply slid in the latching-force-acting direction while being restrained by the restraining guide. Thus, the projecting latch is assuredly made to latch into the receiving hole or the receiving recess. In the case where the press-contact guide is provided between the device body and the cover, the restraint and guiding by the restraining guide may be started by simply pressing the cover into contact with the device body at the press-contact guide, and sliding the cover in the latching-force-acting direction. Hence, the attaching of the cover is further facilitated.

In some embodiments, when the projecting latch latches into the receiving hole or the receiving recess, and the attaching of the cover to the device body is thus complete, the restraint by the restraining guide may be disabled. Therefore, after the completion of the attaching, the cover and the device body are kept out of contact with each other at the restraining guide. Accordingly, noise due to wobbling under external vibrations is reduced.

BRIEF DESCRIPTION OF THE DRAWINGS

FIG. 4A is a rear perspective view of part of the cover and the device body that are pressed into contact with each other at a press-contact guide in the cover-attaching process;

DESCRIPTION OF THE PREFERRED EMBODIMENTS

Onboard Display Device

Figure 1:
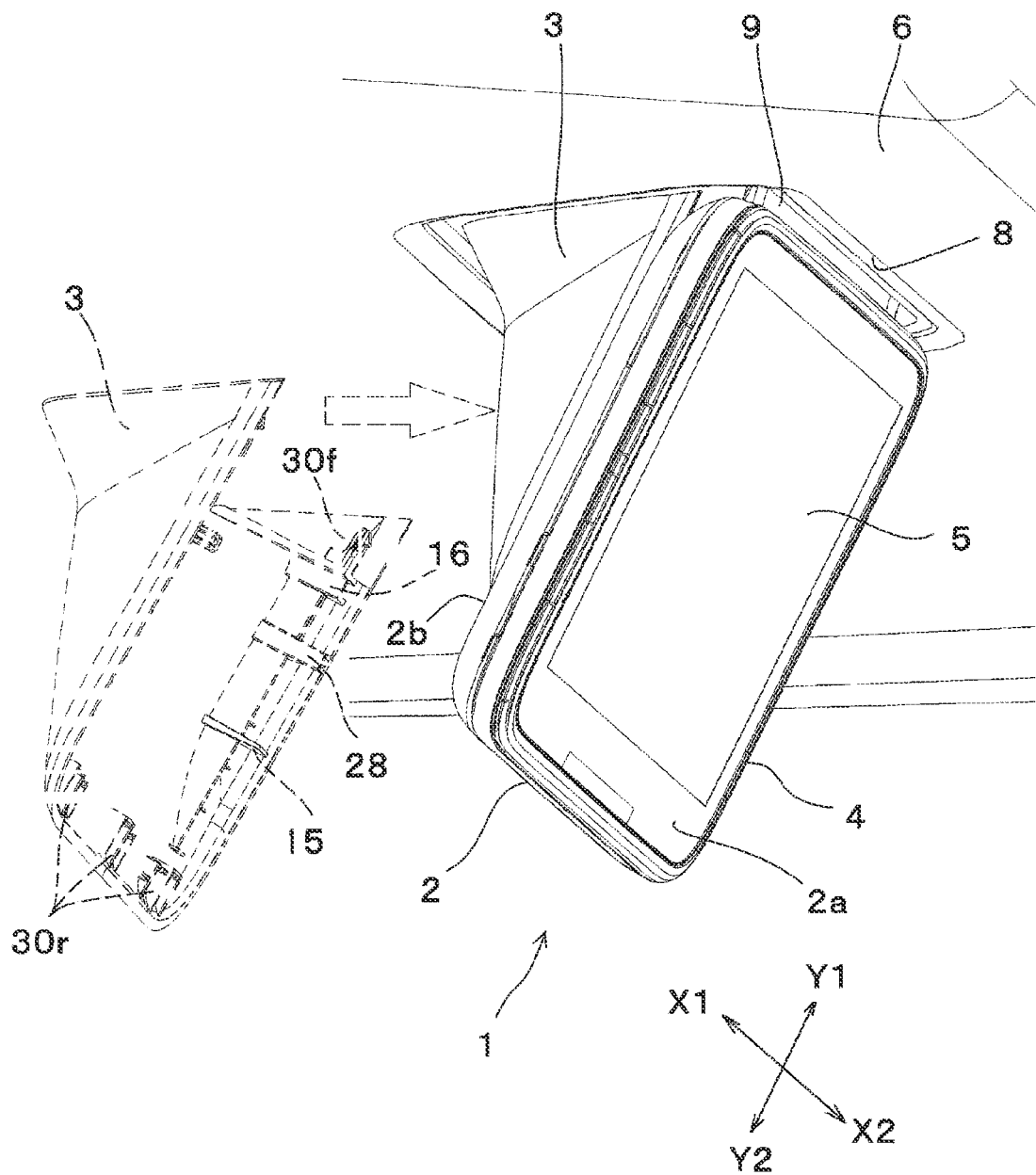
FIG. 1 is a lower front perspective view of an onboard display device that is an exemplary electronic device according to the present disclosure.

FIG. 1 illustrates an onboard display device 1, which is an exemplary electronic device according to an embodiment of the present disclosure. The onboard display device 1 includes a device body 2 and a cover 3. The cover 3 is attached to the back face 2b of the device body 2. The device body 2 includes a housing 4, in which a display unit and an electronic circuit are housed. The display unit has a display screen 5, which is exposed at the front face 2a of the device body 2. The display unit includes display elements such as liquid-crystal display elements, or electroluminescent elements.

Figure 2:
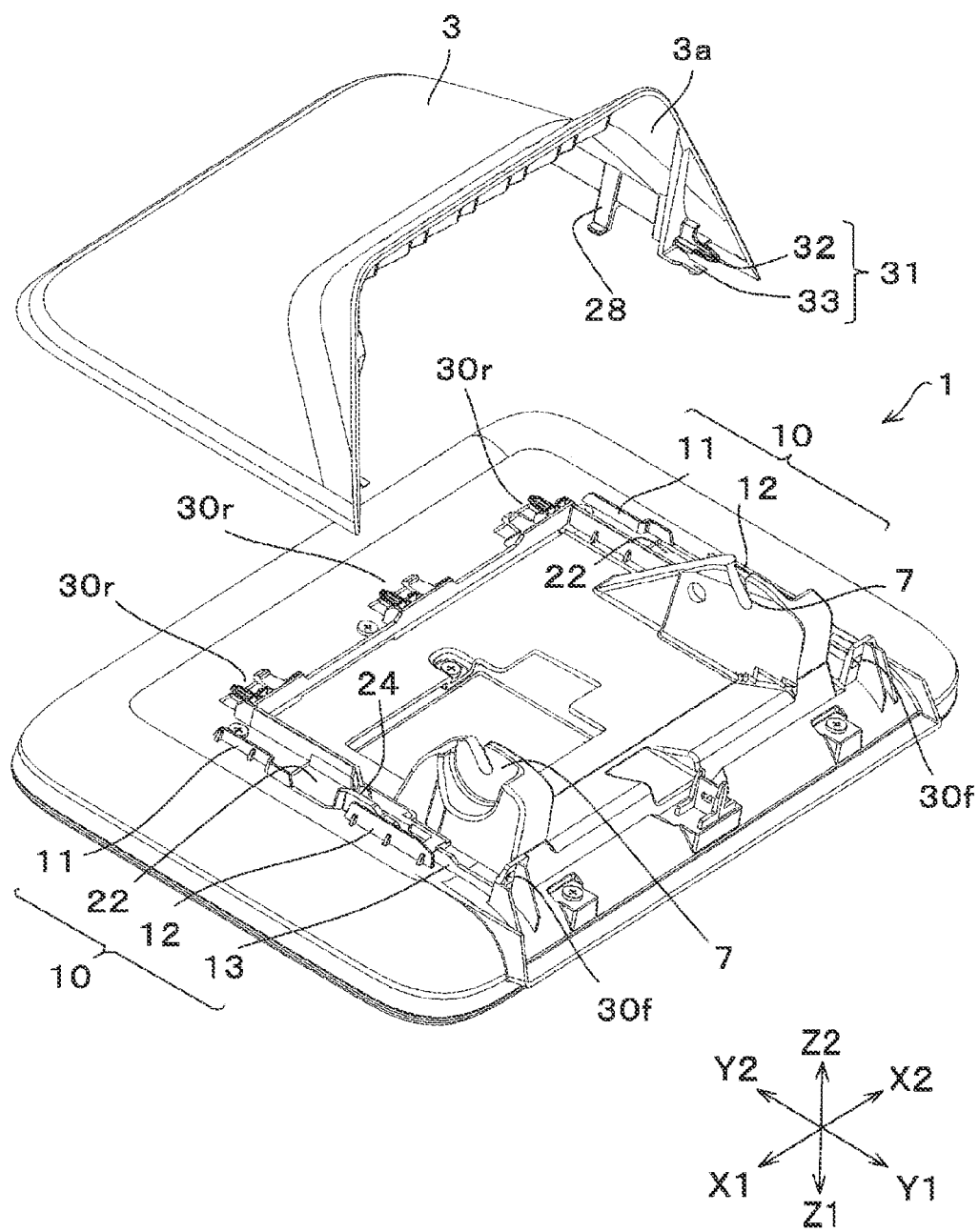
FIG. 2 is a perspective view of the electronic device illustrated in FIG. 1, with a device body thereof being oriented such that a display screen extends horizontally, and with a cover thereof being detached from the device body.

The onboard display device 1 illustrated in FIG. 1 is installed on the ceiling 6 of the vehicle cabin of an automobile, and is viewed obliquely from the lower front. In FIG. 2 and in FIGS. 3 to 7B, the device body 2 is illustrated in an orientation in which the front face 2a thereof extends horizontally in the drawings, for visibility of relevant structures at the back face 2b of the device body 2, and for the process of attaching the cover 3 to the device body 2.

The orientation of the onboard display device 1 is defined as follows. The Y1-Y2 direction represents the top-bottom direction with respect to the front face 2a of the device body 2, with the Y1 direction representing the upward direction and the Y2 direction representing the downward direction. The Y1 direction is also referred to as "latching-force-acting direction" in describing the process of attaching the cover 3 to the device body 2. The X1-X2 direction represents the left-right direction with respect to the front face 2a of the device body 2, with the X1 direction representing the leftward direction and the X2 direction representing the rightward direction. The X1-X2 direction is also referred to as "horizontal direction" in describing the process of attaching the cover 3 to the device body 2. The Z1-Z2 direction defined in FIG. 2 and others represents the front-rear direction with respect to the front face 2a of the device body 2, with the Z1 direction representing the frontward direction, and the Z2 direction representing the rearward direction (the direction toward the back face 2b). The Z1-Z2 direction is also referred to as "vertical direction" in describing the process of attaching the cover 3 to the device body 2. The Z1 direction is also referred to as "approaching direction"; that is, contacting direction or pressing direction, in which the cover 3 is attached to the device body 2. The Z2 direction is also referred to as "retreating direction", in which the cover 3 goes away from the device body 2.

As illustrated in FIG. 2, the device body 2 is provided with attaching mechanisms 7 on the left and right sides of the back face 2a thereof. As illustrated in FIG. 1, the ceiling 6 of the vehicle cabin has an opening 8, in which a supporting mechanism 9 is fixedly provided. When the attaching mechanisms 7 are coupled to the supporting mechanism 9, the device body 2 is fastened to the ceiling 6 in such a manner as to hang from the ceiling 6. After the device body 2 is attached to the ceiling 6, the cover 3 is fastened to the back face 2b of the device body 2, whereby the points of coupling between the attaching mechanisms 7 and the supporting mechanism 9 are covered by the cover 3.

As illustrated in FIG. 1, the device body 2 is set up in an orientation in which the display screen 5 thereof faces obliquely frontward and downward. Guiding mechanisms 10 and latching mechanisms 30f and 30r are provided between the device body 2 and the cover 3, and are therefore unseeable in the process of attaching the cover 3 to the back face 2b of the device body 2. Inevitably, the attaching of the cover 3 to the device body 2 has to be performed by feel. In view of such a situation, in the onboard display device 1, the guiding mechanisms 10 and the latching mechanisms 30f and 30r are configured to facilitate the attaching of the cover 3 to the device body 2.

The onboard display device 1 illustrated in FIG. 2 includes the guiding mechanisms 10 and the latching mechanisms 30f and 30r, which are upper latching mechanisms 30f and lower latching mechanisms 30r, between the device body 2 and the cover 3. Specifically, one guiding mechanism 10 is provided on each of the left and right sides of the device body 2, two upper latching mechanisms 30f are provided on the upper (Y1) side of the device body 2, and three lower latching mechanisms 30r are provided on the lower (Y2) side of the device body 2.

Figure 3:
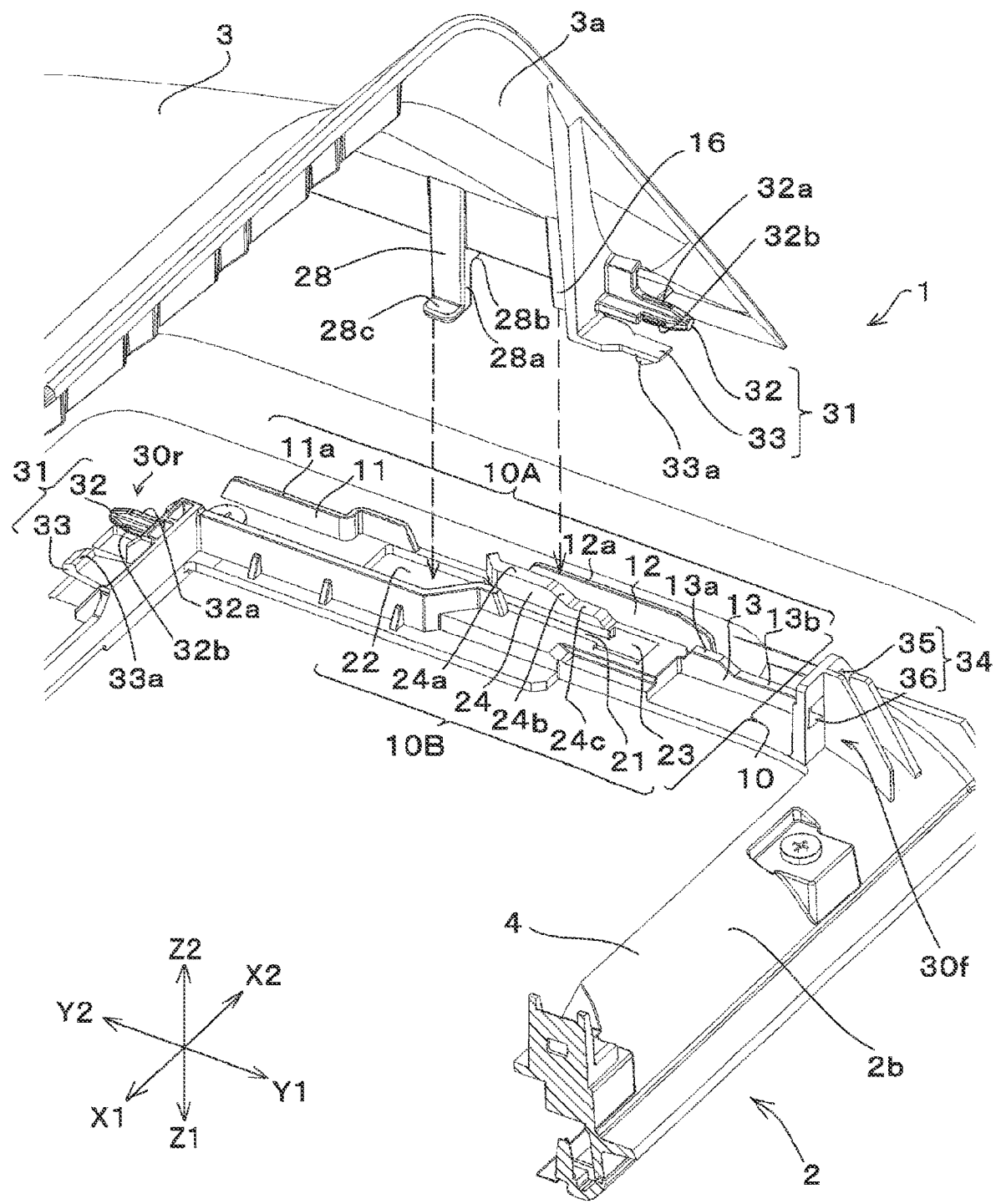
FIG. 3 is a perspective view of part of the electronic device oriented such that the display screen extends horizontally, illustrating how to press the cover into contact with the device body in a cover-attaching process.
Figure 9:
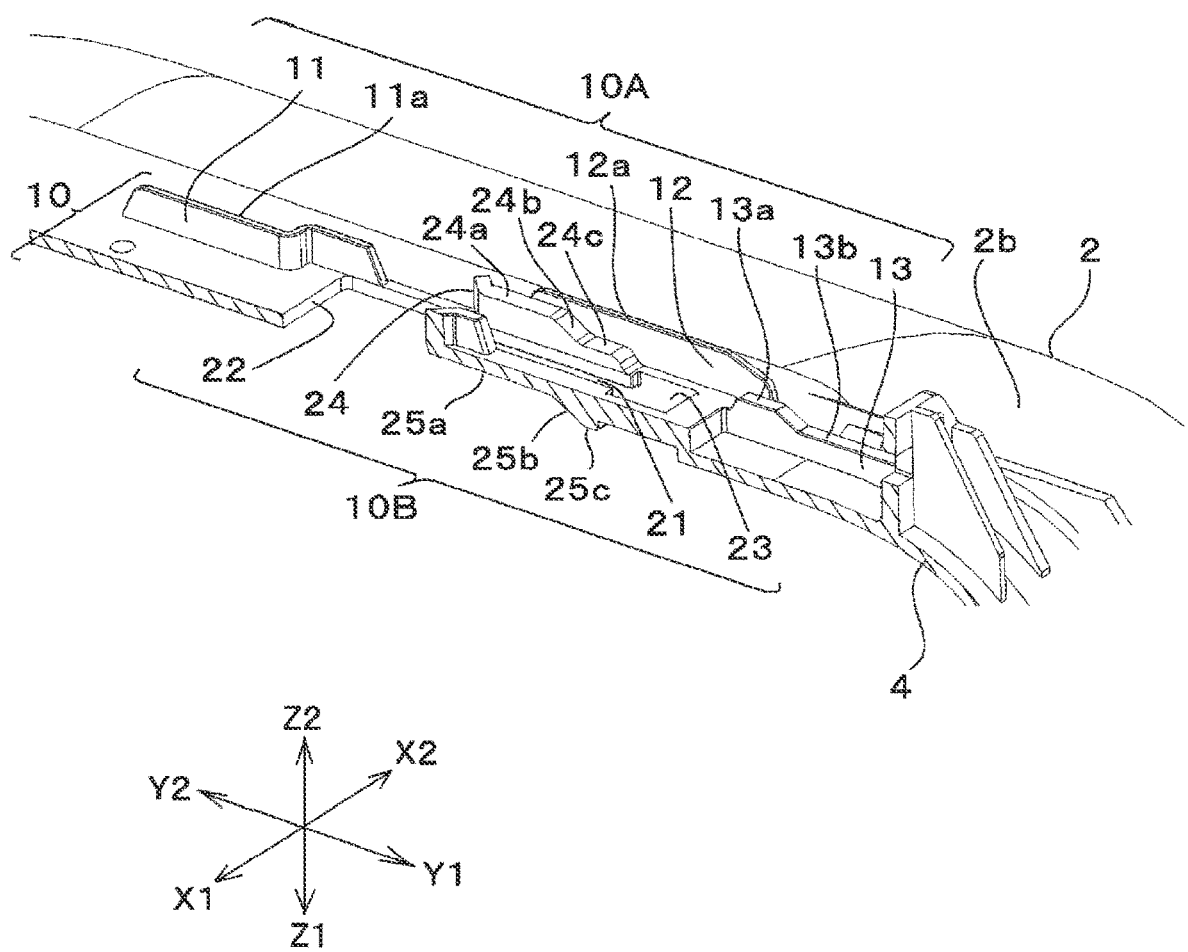
FIG. 9 is a perspective view of a section of part of the device body, illustrating configurations of the restraining guide and the press-contact guide.
Figure 10:
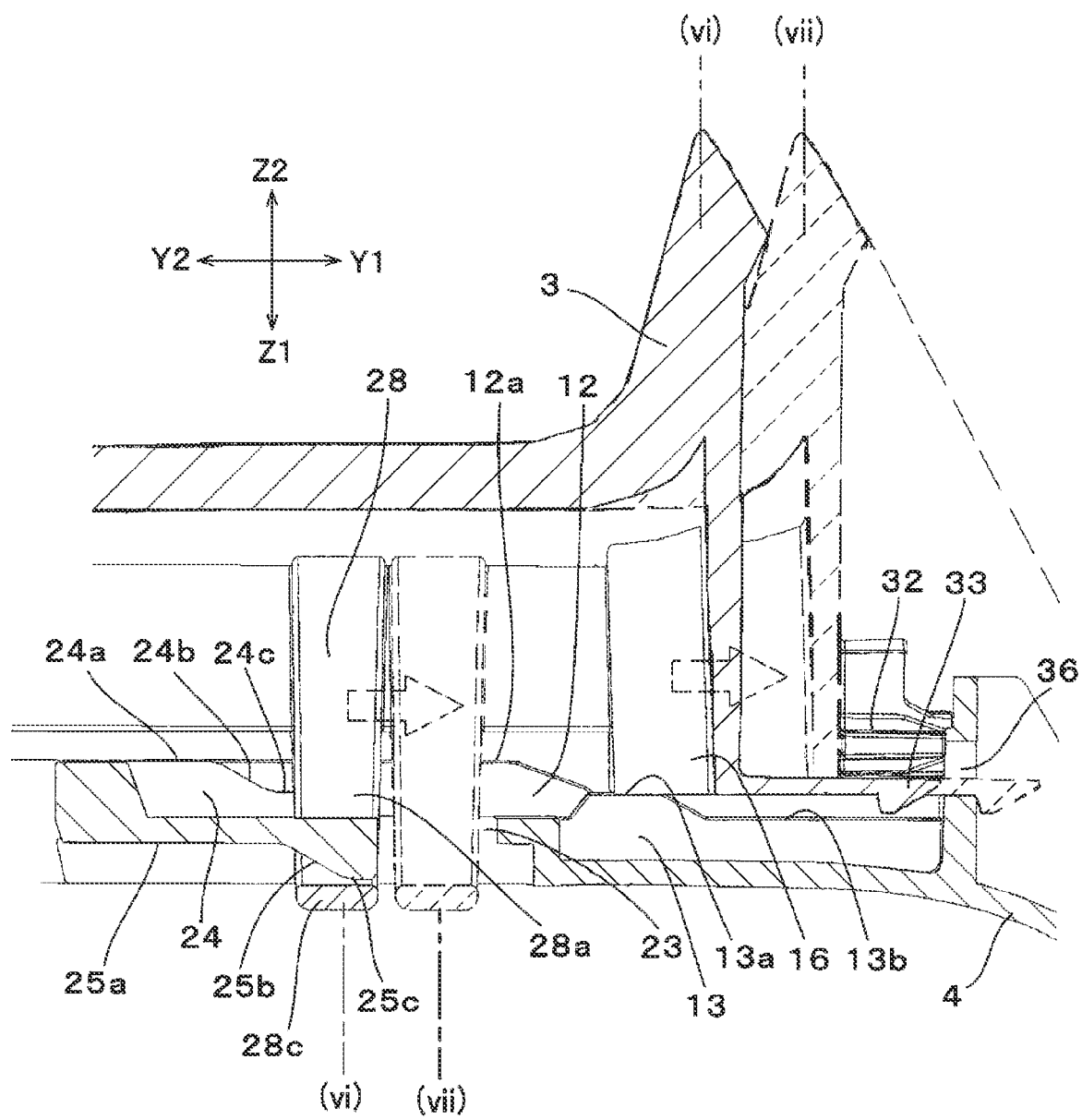
FIG. 10 illustrates a section of the cover and the device body, provided for describing the change in the relative position between a set of the restraining guide and the press-contact guide provided on the device body, and a set of the restraining projection and a press-contact projection provided on the cover, with (vi) denoting the positions of the cover and the restraining projection in the state of sliding illustrated in FIG. 6, and (vii) denoting the positions of the cover and the restraining projection in the state where latching is complete, as illustrated in FIGS. 7A and 7B.

FIGS. 3, 9, and 10 illustrate configurations of one of the guiding mechanisms 10 and one of the upper latching mechanisms 30f that are located on the right (X2) side. FIG. 3 also illustrates a configuration of one of the lower latching mechanisms 30r. As illustrated in FIGS. 3 and 9, each guiding mechanism 10 includes a press-contact guide 10A and a restraining guide 10B. The press-contact guide 10A and the restraining guide 10B are formed as part of the device body 2 and the cover 3.

Press-Contact Guide

As illustrated in FIGS. 3 and 9, the press-contact guide 10A is provided at the back face 2b of the device body 2 and includes: a first guiding rib 11; a second guiding rib 12, which is located on the Y1 side relative to the first guiding rib 11; and, a third guiding rib 13, which is located on the Y1 side relative to the second guiding rib 12. The guiding ribs 11, 12, and 13 are formed integrally with the housing 4 of the device body 2 from a material such as synthetic resin or light metal. The guiding ribs 11, 12, and 13 stand upright in the retreating direction (Z2 direction) and are elongated in the latching-force-acting direction (Y1 direction).

The first guiding rib 11 has at the top thereof a first press-contact slide part 11a. The second guiding rib 12 has at the top thereof a second press-contact slide part 12a. The first press-contact slide part 11a and the second press-contact slide part 12a are at the same height in the Z2 direction from the back face 2b of the device body 2. The third guiding rib 13 has at the top thereof a third press-contact slide part 13a and a press-contact-disabling part 13b.

The press-contact-disabling part 13b is located on the Y1 side relative to the third press-contact slide part 13a, and is continuous with the third press-contact slide part 13a, but at a different height in the Z2 direction from the back face 2b of the device body 2. As illustrated in FIGS. 9 and 10, the third press-contact slide part 13a is at a lower level than the first press-contact slide part 11a and the second press-contact slide part 12a, in such a manner as to be retracted therefrom in the approaching direction (Z1 direction) toward the device body 2. The press-contact-disabling part 13b is at a lower level than the third press-contact slide part 13a, in such a manner as to be retracted therefrom in the approaching direction.

Figure 8A:
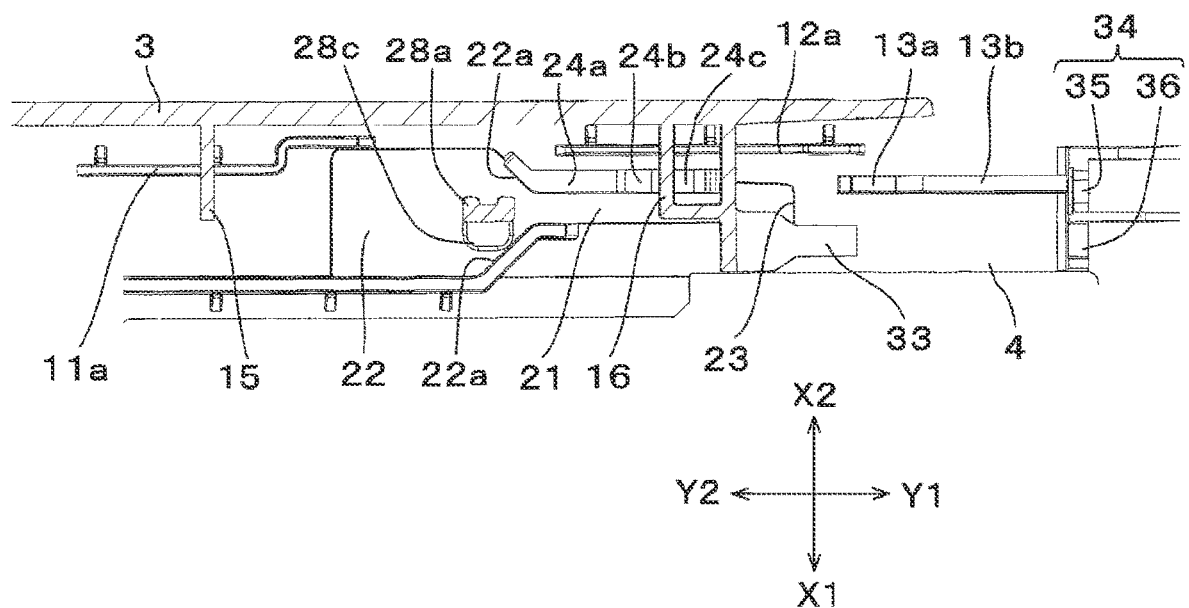
FIG. 8A illustrates a section of part of the cover and the device body in the state illustrated in FIGS. 4A and 4B, provided for describing the change in the relative position between the cover and the device body at the restraining guide and the press-contact guide.
Figure 8B:
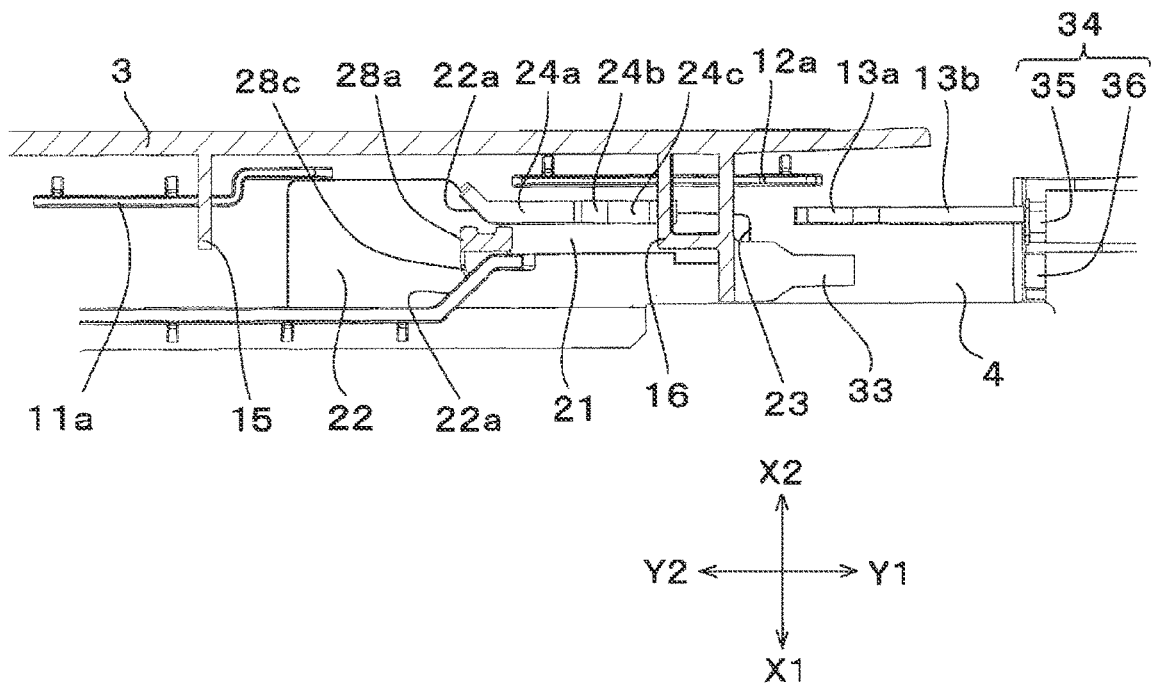
FIG. 8B illustrates a section of part of the cover and the device body in the state illustrated in FIGS. 5A and 5B, provided for describing the change in the relative position between the cover and the device body at the restraining guide and the press-contact guide.

As illustrated in FIG. 4A, the cover 3 has, on a side wall 3a thereof, a first press-contact projection 15 and a second press-contact projection 16, which are constituents of the press-contact guide 10A. The second press-contact projection 16 is located on the Y1 side relative to the first press-contact projection 15. The press-contact projections 15 and 16 are formed integrally with the cover 3 from a material such as synthetic resin or light metal, and each extend in the contacting direction (Z1 direction). In FIGS. 2 and 3, the second press-contact projection 16 is visible, but the first press-contact projection 15 is hidden behind the cover 3. FIG. 8A illustrates a plane section of the press-contact guide 10A, in a state where the first press-contact projection 15 is in contact with the first press-contact slide part 11a of the device body 2, and the second press-contact projection 16 is in contact with the second press-contact slide part 12a.

Restraining Guide

As illustrated in FIGS. 3, 9, and 8A, at the back face 2b of the device body 2, the housing 4 has a restraining oblong hole 21. The restraining oblong hole 21 extends linearly in the latching-force-acting direction (Y1 direction) with a constant width in the horizontal direction (X1-X2 direction). The housing 4 further has an introduction opening 22, which is continuous with the Y2-side end of the restraining oblong hole 21. The introduction opening 22 has a greater width in the horizontal direction (X1-X2 direction) than the restraining oblong hole 21. As illustrated in FIG. 8A, an inner end of the introduction opening 22 that is on the forward side (Y1 side) of the latching-force-acting direction serves as a guiding end 22a. The guiding end 22a is provided on each of the left side (X1 side) and the right side (X2 side) of the restraining oblong hole 21. The two guiding ends 22a are inclined toward each other while extending in the latching-force-acting direction (Y1 direction). The housing 4 further has a restraint-disabling opening 23, which is continuous with the Y1-side end of the restraining oblong hole 21. The restraint-disabling opening 23 has a greater width in the left-right direction (X1-X2 direction) than the restraining oblong hole 21.

The introduction opening 22 and the restraint-disabling opening 23 illustrated in FIG. 8A are each a rectangular hole surrounded by the housing 4. Alternatively, the openings 22 and 23 may each be a polygonal or circular hole. As another example, the openings 22 and 23 may each be a notch or a recess provided in the housing 4, and may be open on the right side (X2 side) or any other side.

As illustrated in FIGS. 3 and 9, the housing 4 further has a restraining rib 24, which is a constituent of the restraining guide 10B, and is formed integrally with the housing 4 in such a manner as to be raised in the retreating direction (Z2 direction). The top of the restraining rib 24 that is on the Z2 side extends in the latching-force-acting direction (Y1 direction). The restraining rib 24 includes at the top thereof a rear vertical restraining guide 24a, a rear inclined restraining guide 24b, and a rear approach restraining guide 24c. The rear inclined restraining guide 24b is continuous with the Y1-side end of the rear vertical restraining guide 24a. The rear approach restraining guide 24c is continuous with the Y1-side end of the rear inclined restraining guide 24b. The height of the rear vertical restraining guide 24a from the back face 2b of the housing 4 is constant. The height of the rear approach restraining guide 24c from the back face 2b of the housing 4 is also constant. However, the rear approach restraining guide 24c is at a lower level than the rear vertical restraining guide 24a in such a manner as to be retracted therefrom in the approaching direction (Z1 direction). The rear inclined restraining guide 24b is inclined toward the back face 2b of the housing 4 while extending in the Y1 direction.

As illustrated in FIGS. 9 and 10, part of a surface (inner surface) of the housing 4 that faces toward the front side (Z1 side) is also a constituent of the restraining guide 10B. The inner surface of the housing 4 forms a front vertical restraining guide 25a, a front inclined restraining guide 25b, and a front approach restraining guide 25c. The front inclined restraining guide 25b is continuous with the Y1-side end of the front vertical restraining guide 25a. The front approach restraining guide 25c is continuous with the Y1-side end of the front inclined restraining guide 25b. The front approach restraining guide 25c is at a lower level than the front vertical restraining guide 25a in such a manner as to be retracted therefrom in the approaching direction (Z1 direction). The front inclined restraining guide 25b is inclined toward the inner side (Z1 side) of the housing 4 while extending in the Y1 direction.

In the restraining guide 10B, a combination of the rear vertical restraining guide 24a and the front vertical restraining guide 25a serves as "vertical restraining guide", and a combination of the rear approach restraining guide 24c and the front approach restraining guide 25c serves as "approach restraining guide". The distance between the rear vertical restraining guide 24a and the front vertical restraining guide 25a in the Z1-Z2 direction is equal to the distance between the rear approach restraining guide 24c and the front approach restraining guide 25c in the Z1-Z2 direction.

Figure 11A:
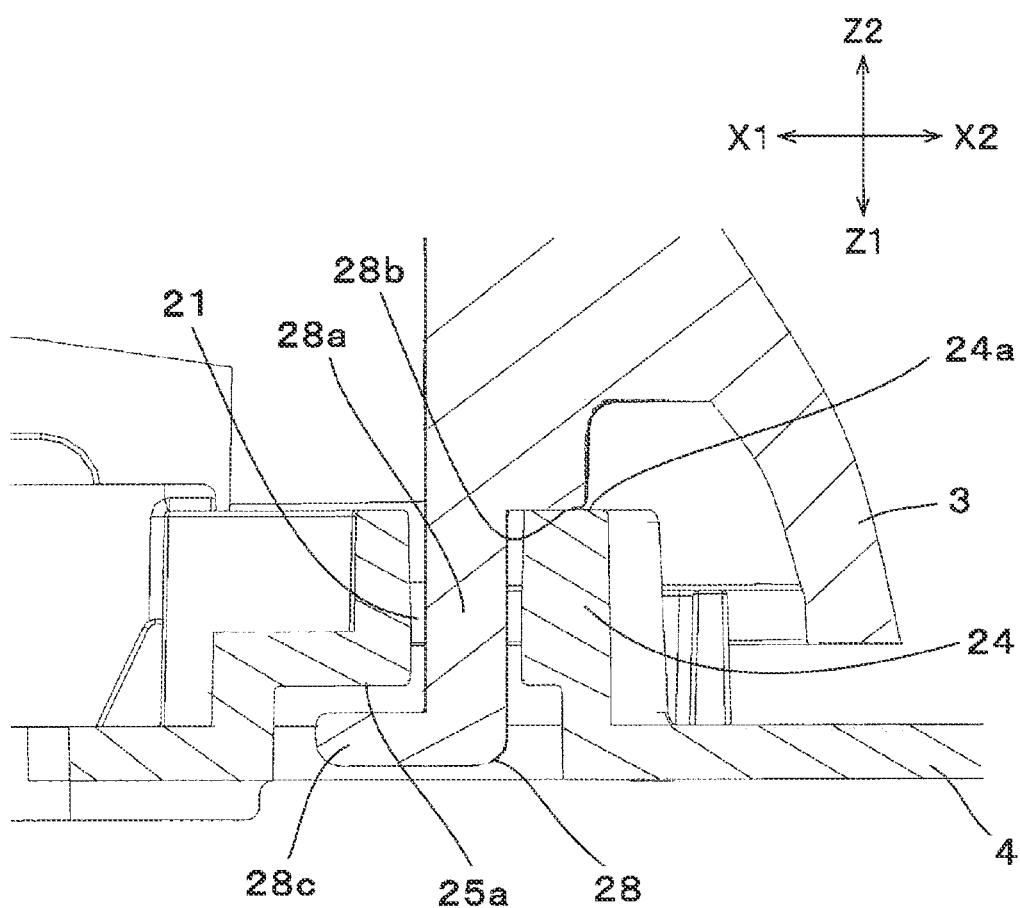
FIG. 11A illustrates how the restraining projection provided on the cover is restrained by the restraining guide provided on the device body, in a sectional view taken along line XIA-XIA in FIG. 5B; and, FIG. 11B illustrates how the restraining projection provided on the cover is restrained by the restraining guide provided on the device body, in a sectional view taken along line XIB-XIB in FIG. 6.

As illustrated in FIGS. 2, 3, and 11A, the cover 3 has a restraining projection 28, which projects in the approaching direction (Z1 direction) from the side wall 3a and is formed integrally with the cover 3. The restraining projection 28 is also a constituent of the restraining guide 10B. The restraining projection 28 includes an intercepting part 28a, a rear facing part 28b, and a front facing part 28c. The intercepting part 28a has a constant width in the horizontal direction (X1-X2 direction) within a certain area in the vertical direction (Z1-Z2 direction). The rear facing part 28b extends from the retreating-side (Z2-side) end of the intercepting part 28a toward the right side (X2 side). The front facing part 28c extends from the approaching-side (Z1-side) end of the intercepting part 28a toward the left side (X1 side).

Figure 11B:
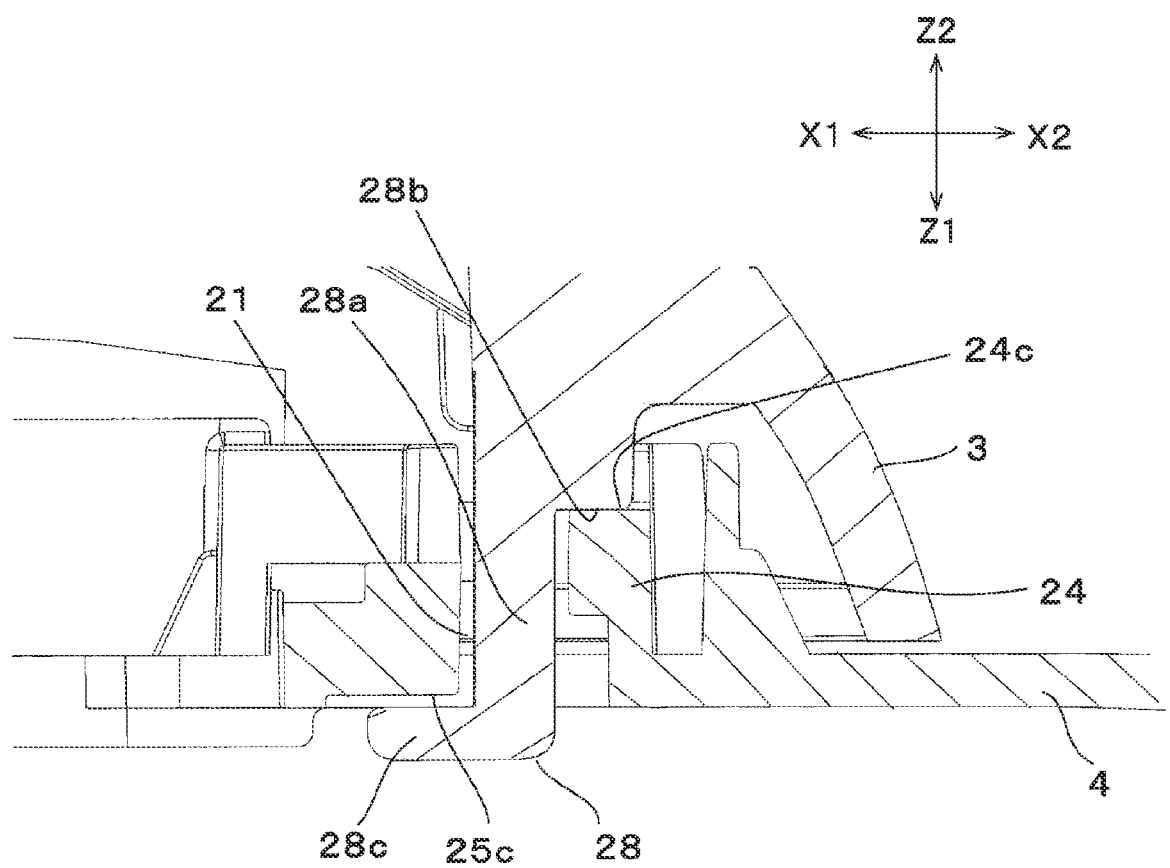

In FIGS. 11A and 11B, the intercepting part 28a of the restraining projection 28 is positioned in the restraining oblong hole 21 provided in the housing 4. The space for the intercepting part 28a in the restraining oblong hole 21 in the horizontal direction (X1-X2 direction) is small enough to restrain the restraining projection 28 from moving in the horizontal direction. In FIG. 11A, the rear facing part 28b of the restraining projection 28 faces the rear vertical restraining guide 24a at the top of the restraining rib 24, and the front facing part 28c faces the front vertical restraining guide 25a at the inner surface of the housing 4. In this state, the restraining projection 28 and the cover 3 are restrained from moving in the vertical direction (Z1-Z2 direction). In FIG. 11B, the rear facing part 28b of the restraining projection 28 faces the rear approach restraining guide 24c at the top of the restraining rib 24, and the front facing part 28c faces the front approach restraining guide 25c at the inner surface of the housing 4. In this state, the restraining projection 28 and the cover 3 are restrained from moving in the vertical direction (Z1-Z2 direction) at a position lowered in the approaching direction (Z1 direction).

As illustrated in FIG. 2, the device body 2 has the guiding mechanism 10 on the left side (X1 side) as well. The configuration of the guiding mechanism 10 provided on the left side and the configuration of the guiding mechanism 10 provided on the right side and described above are in bilateral symmetry in the horizontal direction (X1-X2 direction).

The configuration of the guiding mechanism 10 may be inverted from the one described in the present embodiment. Specifically, in the press-contact guide 10A, the cover 3 may have the first guiding rib 11, the second guiding rib 12, and the third guiding rib 13, while the device body 2 may have the first press-contact projection 15 and the second press-contact projection 16. Likewise, in the restraining guide 10B, the cover 3 may have the rear vertical restraining guide 24a, the front vertical restraining guide 25a, the rear approach restraining guide 24c, the front approach restraining guide 25c, the restraining oblong hole 21, and other relevant elements, while the device body 2 may have the restraining projection 28.

Latching Mechanism

Figure 7A:
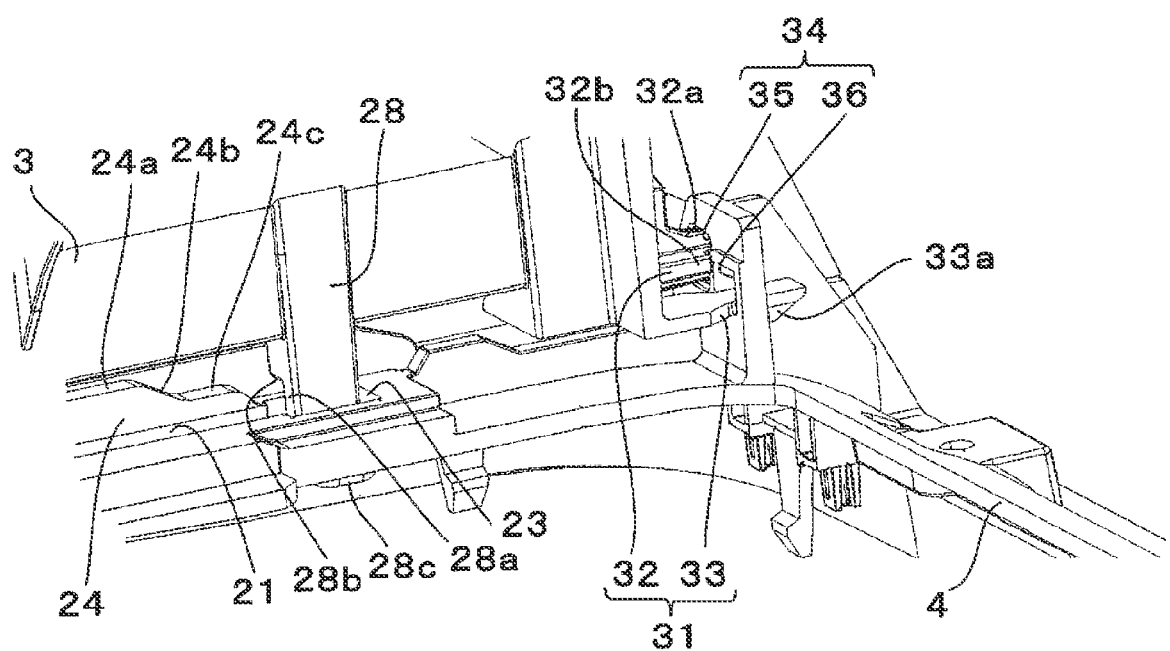
FIG. 7A is a rear perspective view of part of the cover and the device body, illustrating a state established when the cover is further slid in the latching-force-acting direction to cause the projecting latch to latch into the receiving hole, and the attaching of the cover to the device body is thus complete.
Figure 7A:
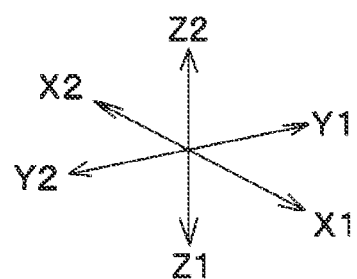
Figure 7B:
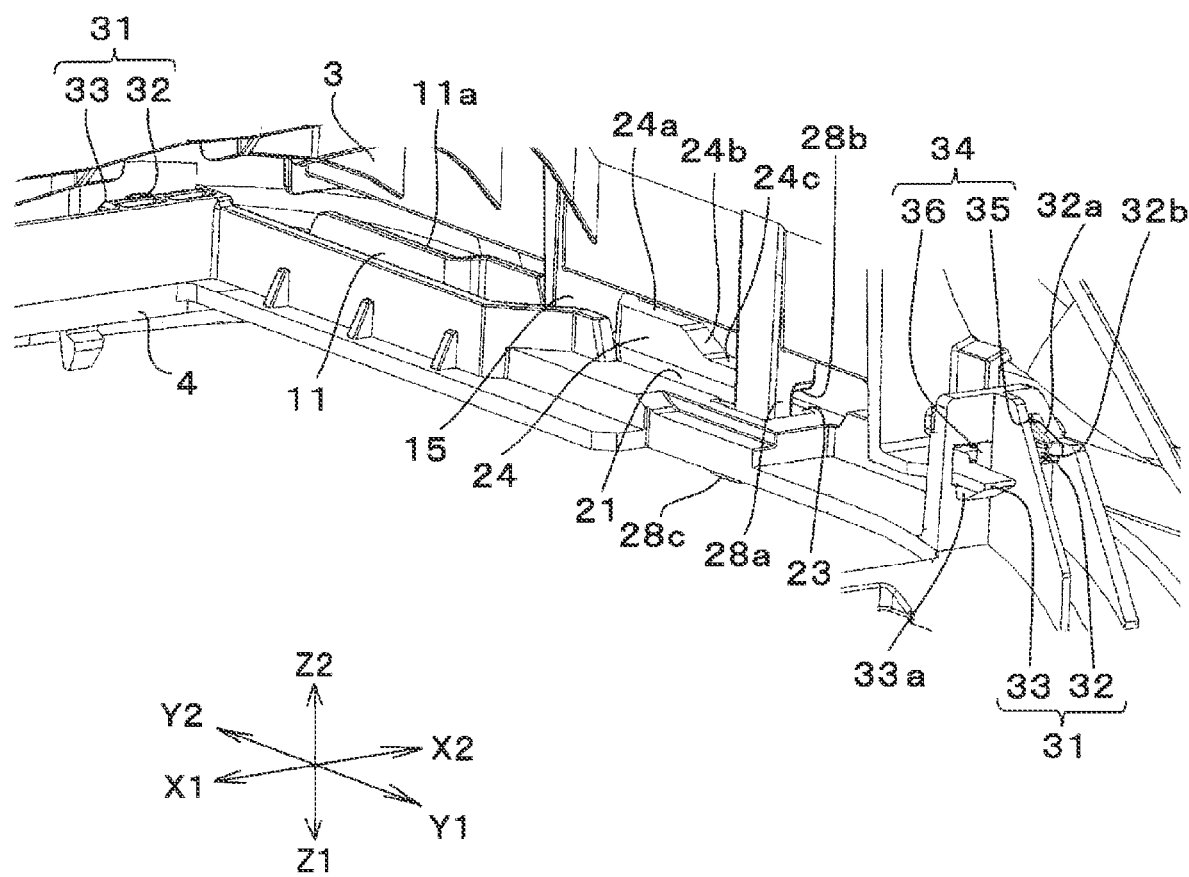
FIG. 7B is a front perspective view of part of the cover and the device body, illustrating the state established when the cover is further slid in the latching-force-acting direction to cause the projecting latch to latch into the receiving hole, and the attaching of the cover to the device body is thus complete.

FIGS. 3 and 4A each illustrate one of the two upper latching mechanisms 30f Each upper latching mechanism 30f includes a projecting latch 31 and a receiving hole 34. The projecting latch 31 is formed integrally with the cover 3. The receiving hole 34 is provided in the housing 4 of the device body 2. The projecting latch 31 includes a locking projection 32 and a latching projection 33. As illustrated in FIGS. 3, 7A, and 7B, the locking projection 32 includes a vertical locking rib 32a and a horizontal locking rib 32b. The vertical locking rib 32a projects in the vertical direction (Z1-Z2 direction), while extending in the latching-force-acting direction (Y1 direction). The horizontal locking rib 32b projects in the horizontal direction (X1-X2 direction), while extending in the latching-force-acting direction (Y1 direction). The latching projection 33 is elastically deformable in the retreating direction (Z2 direction), and includes at the tip thereof a hook 33a, which projects in the Z1 direction and is formed integrally with the latching projection 33. The receiving hole 34 includes a locking hole 35 and a latching hole 36.

When the cover 3 is guided in the latching-force-acting direction (Y1 direction) by the guiding mechanism 10, the locking projection 32 goes into the locking hole 35, and the latching projection 33 goes into the latching hole 36. As illustrated in FIGS. 7A and 7B, when the locking projection 32 goes into the locking hole 35, the vertical locking rib 32a and the horizontal locking rib 32b come into contact with the inner peripheral edge of the locking hole 35, whereby the cover 3 is locked in both the vertical direction (Z1-Z2 direction) and in the horizontal direction (X1-X2 direction) relative to the device body 2. Meanwhile, when the latching projection 33 goes into the latching hole 36, the latching projection 33 elastically deforms in the Z2 direction. When the latching projection 33 further advances, the hook 33a thereof latches onto the Y1-side outer surface of the housing 4 at the Z1-side edge of the latching hole 36. Thus, the cover 3 latches onto the device body 2 and is restrained from moving in the Y2 direction.

Figure 4B:
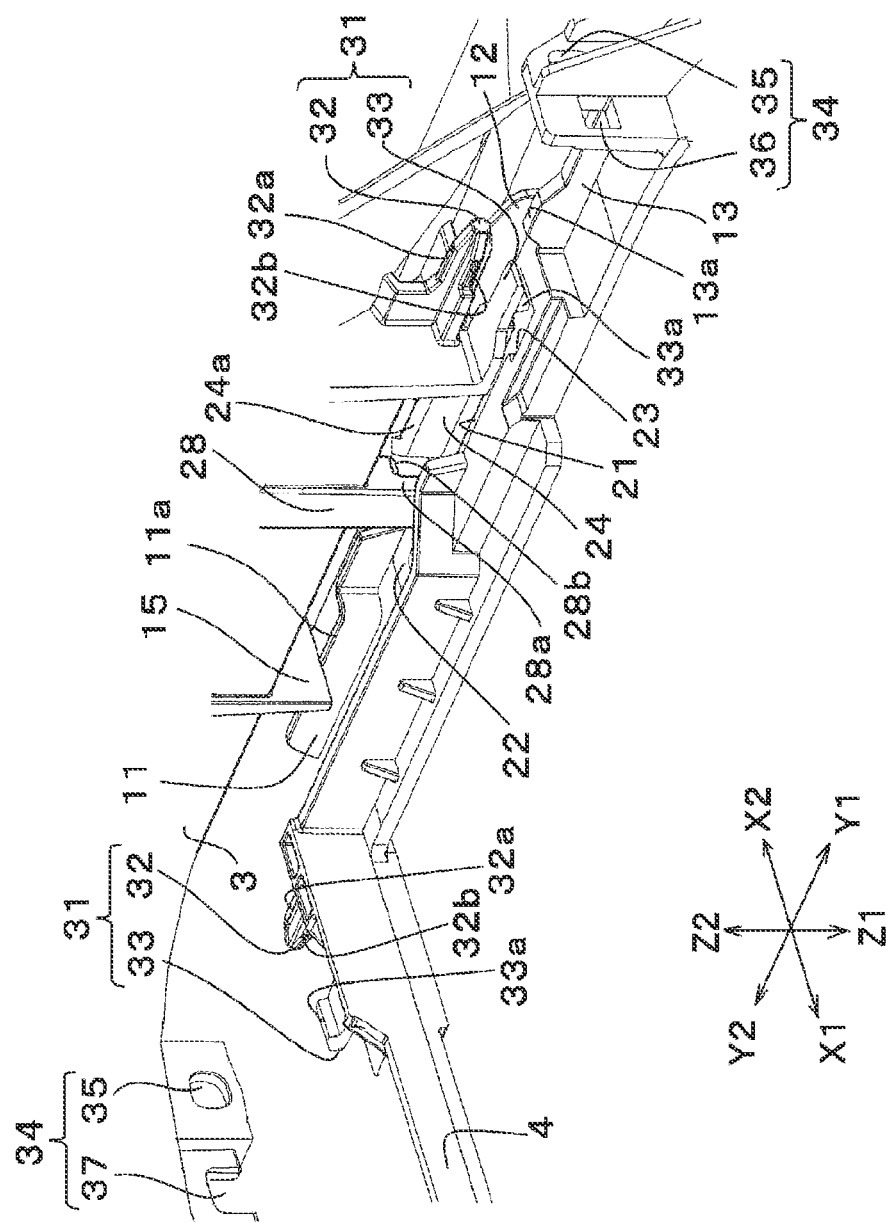
FIG. 4B is a front perspective view of part of the cover and the device body that are pressed into contact with each other at the press-contact guide in the cover-attaching process.
Figure 5A:
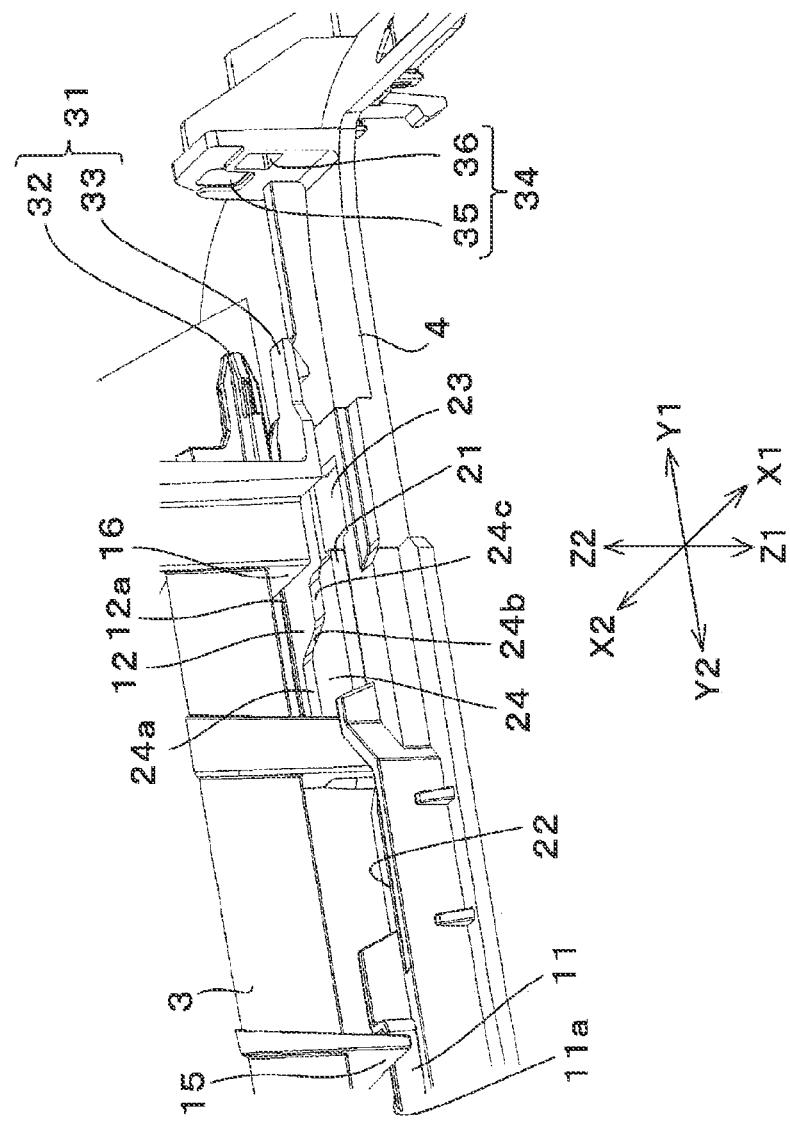
FIG. 5A is a rear perspective view of part of the cover and the device body that are pressed into contact with each other at the press-contact guide in the cover-attaching process, illustrating a state established when the cover is slid in a latching-force-acting direction, and a restraining projection of a restraining guide is thus positioned in a restraining oblong hole.
Figure 5B:
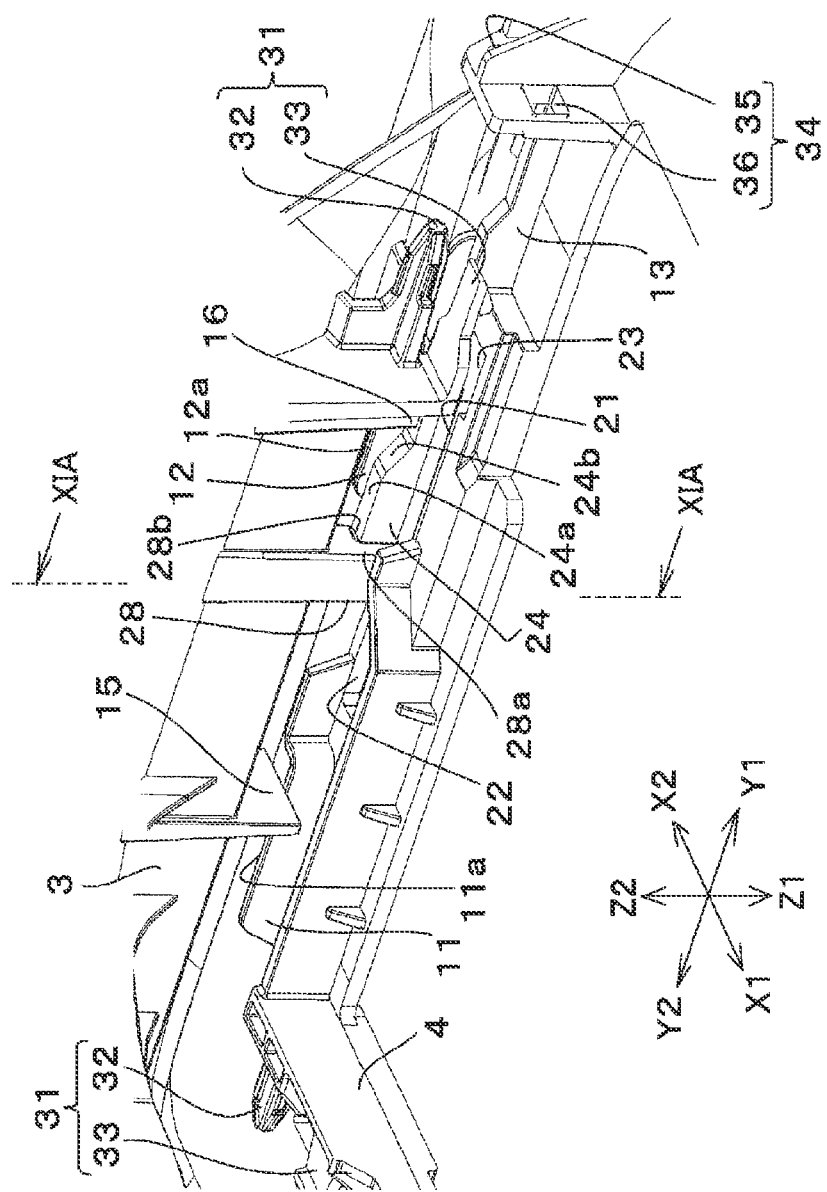
FIG. 5B is a front perspective view of part of the cover and the device body that are pressed into contact with each other at the press-contact guide in the cover-attaching process, illustrating the state established when the cover is slid in the latching-force-acting direction, and the restraining projection of the restraining guide is thus positioned in the restraining oblong hole.

FIG. 4B illustrates one of the three lower latching mechanisms 30r. Each lower latching mechanism 30r includes a projecting latch 31 and a receiving hole 34. The projecting latch 31 is provided on the housing 4 of the device body 2. The receiving hole 34 is provided in the cover 3. The projecting latch 31 includes a locking projection 32 and a latching projection 33, both of which project in the Y2 direction. The locking projection 32 includes: a vertical locking rib 32a, which projects in the vertical direction (Z1-Z2 direction); and, a horizontal locking rib 32b, which projects in the horizontal direction (X1-X2 direction). The latching projection 33 is elastically deformable in the approaching direction (Z1 direction) and includes at the tip thereof a hook 33a, which projects in the Z2 direction and is formed integrally with the latching projection 33. The receiving hole 34 includes a locking hole 35 and a latching recess 37.

In the lower latching mechanism 30r as well, when the cover 3 is guided in the latching-force-acting direction (Y1 direction) by the guiding mechanism 10, the locking projection 32 goes into the locking hole 35, and the latching projection 33 goes into the latching recess 37. When the locking projection 32 goes into the locking hole 35, the cover 3 is locked in both the vertical direction (Z1-Z2 direction) and in the horizontal direction (X1-X2 direction) relative to the device body 2. Meanwhile, when the latching projection 33 goes into the latching recess 37, the latching projection 33 elastically deforms in the Z1 direction. Then, the hook 33a latches onto the Y2-side outer surface of the housing 4 at the Z2-side edge of the latching recess 37. Thus, the cover 3 is fastened to the device body 2 and is restrained from moving in the Y1 direction.

When the cover 3 is moved in the latching-force-acting direction (Y1 direction), the upper latching mechanisms 30f and the lower latching mechanisms 30r simultaneously behave such that the projecting latches 31 latch into the respective receiving holes 34. Thus, the cover 3 is attached to and fastened to the device body 2 in such a manner as not to move easily.

In the upper latching mechanisms 30f and the lower latching mechanisms 30r, some or all of the locking holes 35 and the latching holes 36 included in the receiving holes 34 may be replaced with receiving recesses. Herein, a receiving recess refers to a hole with part of the peripheral edge thereof being open, such as the latching recess 37. Alternatively, the receiving recess may be shaped like a folder having an opening with a predetermined length (depth) in the Y1-Y2 direction. Even if the receiving holes 34 are replaced with such receiving recesses, specifically locking recesses and latching recesses, the cover 3 is positioned relative to the device body 2 when the locking projections 32 are inserted into the respective locking recesses, and the cover 3 latches onto the device body 2 when the latching projections 33 are inserted into the respective latching recesses.

How to Attach Cover

How to attach the cover 3 to the device body 2 will now be described.

Referring to FIG. 1, to attach the onboard display device 1 to a vehicle cabin, the cover 3 begins detached from the device body 2, as illustrated by the broken lines. In this state, the attaching mechanisms 7 (see FIG. 2) at the back face 2b of the device body 2 are coupled to the supporting mechanism 9 located in the opening 8 of the ceiling 6. Subsequently, the cover 3 is attached to the back face 2*b* of the device body 2 attached to the ceiling 6, whereby the points of coupling between the attaching mechanisms 7 and the supporting mechanism 9 are covered by the cover 3. In this process, since the points of engagement between the back face 2*b* of the device body 2 and the cover 3 are difficult to see, the attaching of the cover 3 is performed by the feel. Nevertheless, in the onboard display device 1 according to the present embodiment, the guiding mechanisms 10 and the latching mechanisms 30*f* and 30*r* configured as above make it possible to easily and assuredly fasten the cover 3 to the device body 2. Specifically, the cover 3 is pressed against the back face 2*b* of the device body 2 and is then slid in the latching-force-acting direction (Y1 direction).

The cover 3 is attached to the device body 2 in the orientation illustrated in FIG. 1. However, for simplicity, the following description of the process of attaching the cover 3 that is given with reference to FIG. 2 and the subsequent drawings is based on the orientation in which the front face 2*a* of the device body 2 extends horizontally.

Pressing Cover into Contact

In the process of attaching the cover 3, the cover 3 is fitted to the back face 2*b* of the device body 2 in the Z1 direction. Specifically, when the restraining projection 28 provided on each of the left and right sides of the cover 3 is inserted into the introduction opening 22 provided in the housing 4, as illustrated in FIGS. 4A, 4B, and 8A, the first press-contact projection 15 provided on the cover 3 is pressed into contact with the first press-contact slide part 11*a* of the first guiding rib 11 provided on the housing 4, while the second press-contact projection 16 provided on the cover 3 is pressed into contact with the second press-contact slide part 12*a* of the second guiding rib 12.

If the restraining projection 28 fails to be inserted into the introduction opening 22, the restraining projection 28 interferes with the back face 2*b* of the housing 4. Such a situation hinders the first press-contact projection 15 and the second press-contact projection 16 from coming into contact with the first press-contact slide part 11*a* and the second press-contact slide part 12*a*. That is, when the restraining projection 28 is successfully inserted into the introduction opening 22, the cover 3 is guided such that the first press-contact projection 15 comes into contact with the first press-contact slide part 11*a*, and the second press-contact projection 16 comes into contact with the second press-contact slide part 12*a*. Therefore, even if the points of contact between the cover 3 and the device body 2 are directly unseeable, pressing the cover 3 into contact with the back face 2*b* of the device body 2 provides a tactile sensation of whether the press-contact projections 15 and 16 are successfully brought into contact with the respective press-contact slide parts 11*a* and 12*a*. Hence, whether the cover 3 is pressed into contact with the back face 2*b* of the device body 2 in a proper position is recognizable.

Sliding Cover in Latching-Force-Acting Direction

Subsequently, as illustrated in FIGS. 4A, 4B, and 8A, while the first press-contact projection 15 and the second press-contact projection 16 are kept in contact with the first press-contact slide part 11*a* and the second press-contact slide part 12*a*, the cover 3 is slid in the latching-force-acting direction (Y1 direction). This sliding causes the intercepting part 28*a* of the restraining projection 28 provided on the cover 3 to go into the restraining oblong hole 21 provided in the housing 4.

FIGS. 5A, 5B, 8B, and 11A illustrate a state where the intercepting part 28*a* has just reached the restraining oblong hole 21. In this state, the intercepting part 28*a* positioned in the restraining oblong hole 21 is restrained from moving significantly in the horizontal direction (X1-X2 direction). Furthermore, as illustrated in FIG. 11A, in a sectional view, the rear facing part 28*b* of the restraining projection 28 faces the rear vertical restraining guide 24*a* at the top of the restraining rib 24, and the front facing part 28*c* of the restraining projection 28 faces the front vertical restraining guide 25*a* at the inner surface of the housing 4, whereby the restraining projection 28 is restrained from moving significantly in the vertical direction (Z1-Z2 direction). Therefore, once the cover 3 reaches this position, the cover 3 is hardly detachable from the back face 2*b* of the device body 2, even if the force of pressing the cover 3 into contact with the back face 2*b* is reduced.

Figure 6:
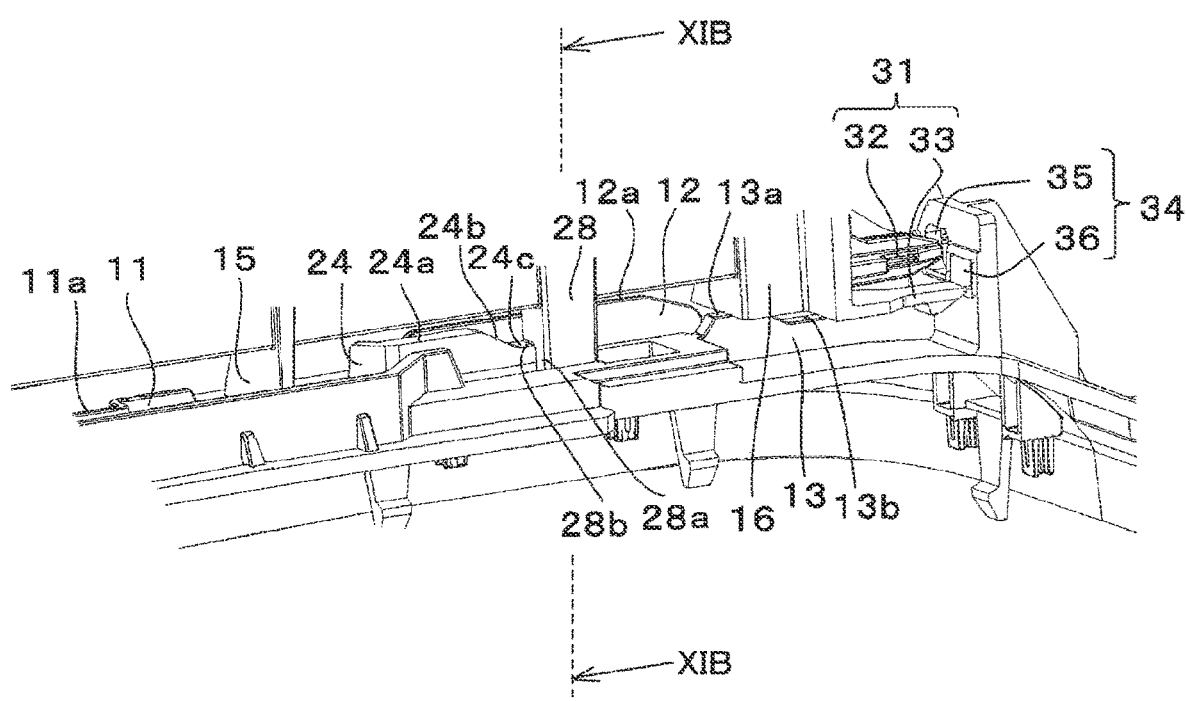
FIG. 6 is a rear perspective view of part of the cover and the device body, illustrating a state established when the cover is further slid in the latching-force-acting direction to be guided by an approach restraining guide of the restraining guide to a position close to the device body, where a projecting latch faces a receiving hole to be able to latch into the receiving hole.
Figure 6:
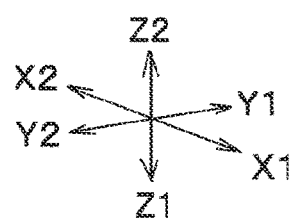
Figure 8C:
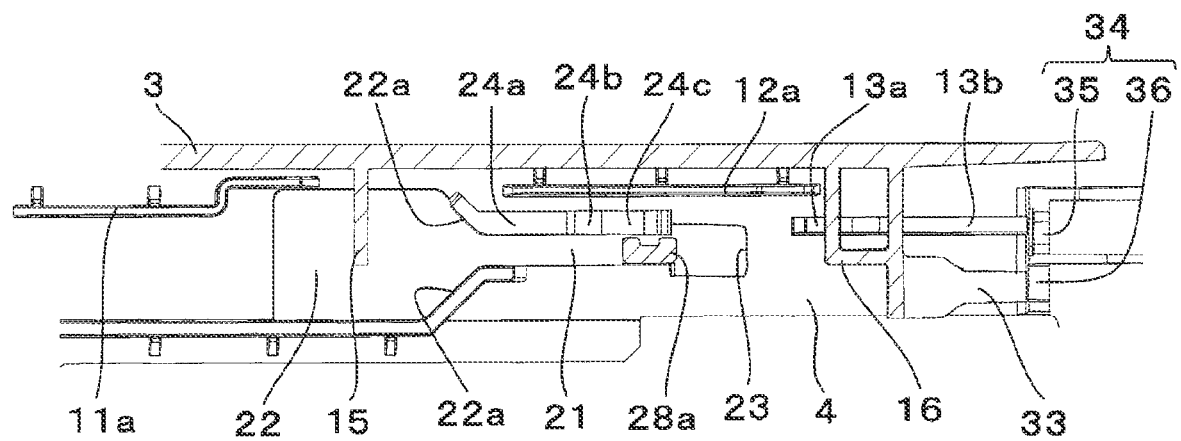
FIG. 8C illustrates a section of part of the cover and the device body in the state illustrated in FIG. 6, provided for describing the change in the relative position between the cover and the device body at the restraining guide and the press-contact guide.
Figure 8C:
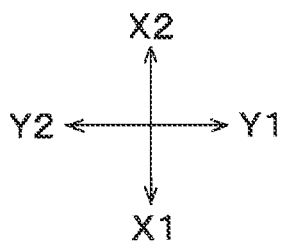

FIGS. 6 and 8C illustrate a state where the cover 3 has been slid further in the latching-force-acting direction (Y1 direction), and the intercepting part 28*a* of the restraining projection 28 has reached the Y1-side end of the restraining oblong hole 21 provided in the housing 4. In this state, the intercepting part 28*a* of the restraining projection 28 is still positioned in the restraining oblong hole 21, and is therefore restrained from moving in the horizontal direction (X1-X2 direction). FIG. 10 illustrates, in a sectional view, the positions of the cover 3 and the restraining projection 28 at two points in time that are taken while the cover 3 and the restraining projection 28 are moving in the latching-force-acting direction (Y1 direction). In FIG. 10, the restraining projection 28 positioned as illustrated in FIGS. 6 and 8C is illustrated by the solid line and denoted by (vi). A section of the restraining projection 28 positioned as illustrated in FIG. 6 that is taken along line XIB-XIB is illustrated in FIG. 11B.

As illustrated in FIGS. 6, 10, and 11B, when the cover 3 that is being restrained by the restraining guide 10B is slid in the latching-force-acting direction (Y1 direction), the rear facing part 28*b* of the restraining projection 28 moves from the rear vertical restraining guide 24*a* of the restraining rib 24 along the rear inclined restraining guide 24*b*, and comes to face the rear approach restraining guide 24*c*. Meanwhile, the front facing part 28*c* of the restraining projection 28 moves from the front vertical restraining guide 25*a* at the inner surface of the housing 4 along the front inclined restraining guide 25*b*, and comes to face the front approach restraining guide 25*c*.

When the restraining projection 28 thus guided reaches the "approach restraining guide" constituted by the rear approach restraining guide 24*c* and the front approach restraining guide 25*c*, the restraining projection 28 is moved in the Z1 direction while the cover 3 is kept being restrained in the vertical direction (Z1-Z2 direction), whereby the cover 3 is guided to approach the back face 2*b* of the device body 2. When the cover 3 approaches the back face 2*b* of the device body 2, the upper latching mechanism 30*f* behaves as illustrated in FIG. 6. That is, the locking projection 32 included in the projecting latch 31 reaches such a height level as to be insertable into the locking hole 35 included in the receiving hole 34, while the latching projection 33 reaches such a height level as to be insertable into the latching hole 36. The same applies to the lower latching mechanism 30*r*, as illustrated in FIG. 4B. That is, the locking projection 32 provided on the device body 2 reaches such a height level as to face the locking hole 35 of the cover 3 to be able to go thereinto, while the latching projection 33 reaches such a height level as to face the latching recess 37 to be able to latch thereinto.

In this state, as illustrated in FIG. 6, and as denoted by (vi) in FIG. 10, the second press-contact projection 16 provided on the cover 3 leaves the second press-contact slide part 12*a*, and most of the press-contact projection 16 rests on the third press-contact slide part 13a of the third guiding rib 13. Since the second press-contact projection 16, which is substantially integrated with the projecting latch 31, rests on the third press-contact slide part 13a, the projecting latch 31 is stabilized at such a height level as to face the receiving hole 34.

In the restraining guide 10B, when the cover 3 is slid in the latching-force-acting direction, the latching projection 28 is restrained by the "vertical restraining guide". When the cover 3 is further slid in the latching-force-acting direction, the latching projection 28 is guided to the "approach restraining guide", where the cover 3 is made to approach the back face 2b of the device body 2. Thus, the projecting latch 31 is positioned to face the receiving hole 34. This approaching motion of the cover 3 is sensible by the hand. Therefore, whether the cover 3 has successfully reached such a position as to be latchable onto the device body 2 is assuredly recognized, despite the unseeable situation.

Latching by Latching Mechanism

Figure 8D:
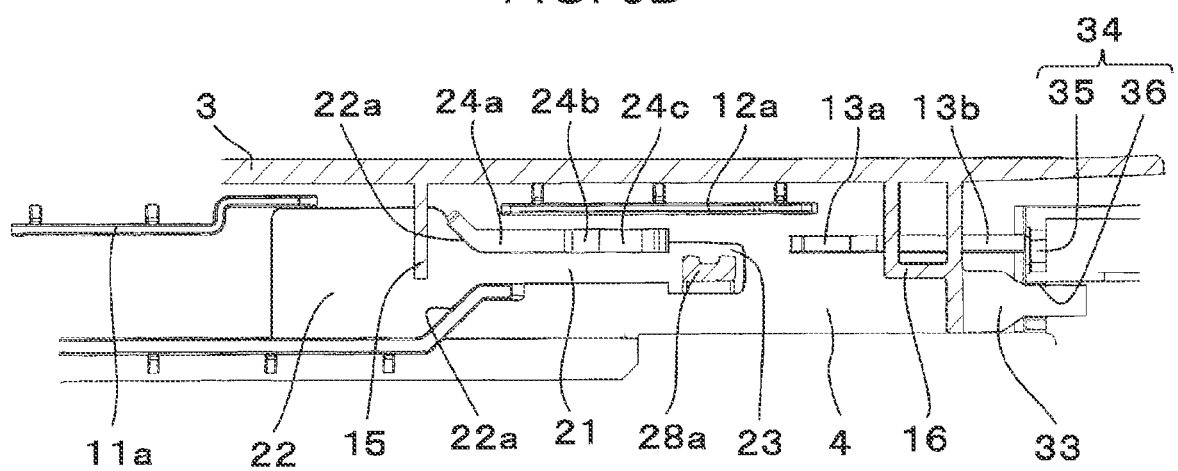
FIG. 8D illustrates a section of part of the cover and the device body in the state illustrated in FIGS. 7A and 7B, provided for describing the change in the relative position between the cover and the device body at the restraining guide and the press-contact guide.
Figure 8D:
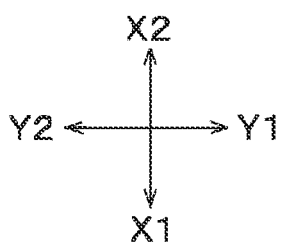

As illustrated in FIG. 6, and as denoted by (vi) in FIG. 10, when the cover 3 guided to the position close to the back face 2b of the device body 2 is further moved by the hand in the latching-force-acting direction (Y1 direction), the cover 3 and the device body 2 latch onto each other at the latching mechanisms 30f and 30r, and are thus fastened to each other. This state is illustrated in FIGS. 7A, 7B, and 8D. In this state, referring to FIG. 10, the restraining projection 28 and the cover 3 are positioned as illustrated by the broken lines and denoted by (vii).

When the cover 3 is positioned as illustrated in FIGS. 7A, 7B, and 8D, and as denoted by (vii) in FIG. 10, the upper latching mechanism 30f behaves as follows. The locking projection 32 included in the projecting latch 31 goes into the locking hole 35 included in the receiving hole 34, while the latching projection 33 goes into the latching hole 36. When the locking projection 32 goes into the locking hole 35, the vertical locking rib 32a and the horizontal locking rib 32b come into contact with the inner peripheral edge of the locking hole 35, whereby the cover 3 is restrained from moving in both the vertical direction (Z1-Z2 direction) and in the horizontal direction (X1-X2 direction) relative to the device body 2. Meanwhile, when the latching projection 33 goes into the latching hole 36, the hook 33a latches onto the Y1-side outer surface of the housing 4 at the Z1-side edge of the latching hole 36. Likewise, in the lower latching mechanism 30r, the locking projection 32 goes into the locking hole 35, whereby the cover 3 is restrained in both the vertical direction (Z1-Z2 direction) and in the horizontal direction (X1-X2 direction) relative to the device body 2. Simultaneously, the latching projection 33 goes into the latching recess 37, and the hook 33a latches onto the Y2-side outer surface of the housing 4 at the Z2-side edge of the latching recess 37. Since the upper latching mechanism 30f and the lower latching mechanism 30r both behave such that the projecting latches 31 latch into the respective receiving holes 34, the cover 3 is positioned relative to the device body 2 and is fastened to the device body 2.

When the device body 2 and the cover 3 latch onto each other and are thus fastened to each other at the upper latching mechanism 30f and the lower latching mechanism 30r, as illustrated in FIGS. 7A, 7B, and 8D, and as denoted by (vii) in FIG. 10, the press-contact guide 10A behave as follows. The first press-contact projection 15 moves in the Y1 direction to leave the first press-contact slide part 11a. Meanwhile, the second press-contact projection 16 moves in the Y1 direction to leave the second press-contact slide part 12a, and further moves in the Y1 direction to leave the third press-contact slide part 13a, eventually reaching a position spaced apart from the press-contact-disabling part 13b in the Z2 direction. Hence, in the press-contact guide 10A, the device body 2 and the cover 3 go out of contact with each other. Meanwhile, in the restraining guide 10B, the restraining projection 28 moves into the restraint-disabling opening 23 provided in the housing 4. Hence, in the restraining guide 10B, as well, the device body 2 and the cover 3 go out of contact with each other.

When the device body 2 and the cover 3 latch onto each other and are thus fastened to each other at the upper latching mechanism 30f and the lower latching mechanism 30r, the device body 2 and the cover 3 go out of contact with each other in both the press-contact guide 10A and the restraining guide 10B. Therefore, even if the onboard display device 1 is subjected to external vibrations, such as vibrations of the vehicle body, noise due to wobbling between the device body 2 and the cover 3 is prevented from occurring in the press-contact guide 10A and in the restraining guide 10B.

The point in time when the device body 2 and the cover 3 go out of contact with each other in the press-contact guide 10A and in the restraining guide 10B, as described above, is preferably after the point in time when the cover 3 positioned as illustrated in FIG. 6, and as denoted by (vi) in FIG. 10, is moved in the latching-force-acting direction (Y1 direction), and the projecting latch 31 starts to go into the receiving hole 34 in at least one of the upper latching mechanism 30f and the lower latching mechanism 30r. In such a configuration, the cover 3 assuredly keeps being positioned relative to the device body 2 and fastened to the device body 2 by at least one of the upper latching mechanism 30f and the lower latching mechanism 30r, even after the cover 3 goes out of contact with the device body 2 in the press-contact guide 10A and in the restraining guide 10B.

Specific embodiments and specific examples of the present disclosure have been described above with reference to the attached drawings. The specific embodiments and specific examples described above are only specific examples of the present disclosure, which are used to understand the present disclosure, rather than limit the scope of the present disclosure. Those skilled in the art can make various modifications, combinations and reasonable omissions of elements in specific embodiments and specific examples based on the technical ideas of the present disclosure, and the embodiments thus obtained are also included in the scope of the present disclosure. For example, the above-mentioned embodiments and specific examples may be combined with each other, and the combined embodiments are also included in the scope of the present disclosure. Therefore, it is intended that this disclosure not be limited to the particular embodiments disclosed, but that the invention will include all embodiments falling within the scope of the appended claims.

The invention claimed is:

1. A cover-equipped electronic device comprising:
a device body; and
a cover to be attached to the device body,
wherein one of the device body and the cover has a projecting latch, and another of the device body and the cover has a receiving hole or a receiving recess that is to receive the projecting latch, the projecting latch being configured to latch into the receiving hole or the receiving recess and make the cover attached to the device body, when the cover is moved in a predetermined latching-force-acting direction;

wherein a restraining guide is provided between the device body and the cover and is configured to allow the cover to move in the latching-force-acting direction, while restraining the cover in a direction intersecting the latching-force-acting direction;

wherein restraint by the restraining guide is disabled when attaching of the cover to the device body is complete, with the projecting latch latched into the receiving hole or the receiving recess; and wherein the projecting latch includes:
  a locking projection configured to lock the cover in a vertical direction in such a manner as to prevent the cover from moving away from the device body, and configured to further lock the cover in a horizontal direction intersecting both the vertical direction and the latching-force-acting direction, the locking projection locking the cover when being inserted into the receiving hole or the receiving recess; and
  a latching projection configured to make the cover unmovable in the latching-force-acting direction.

2. The cover-equipped electronic device according to claim 1,
wherein a press-contact guide is provided between the device body, and the cover and is configured to cause the device body and the cover to be pressed into contact with each other, when the cover is pressed against the device body in the direction intersecting the latching-force-acting direction; and
wherein while the cover that is kept in contact with the device body at the press-contact guide is being moved in the latching-force-acting direction, restraint and guiding by the restraining guide is started.

3. The cover-equipped electronic device according to claim 1,
wherein the restraining guide includes
  a vertical restraining guide configured to guide the cover in the latching-force-acting direction while restraining the cover in a vertical direction from moving away from the device body; and
  an approach restraining guide configured to bring the cover moved in the latching-force-acting direction along the vertical restraining guide to a position close to the device body, where the projecting latch faces the receiving hole or the receiving recess to be able to latch into the receiving hole or the receiving recess.

4. The cover-equipped electronic device according to claim 3,
wherein the restraining guide is configured to guide the cover while further restraining the cover in a horizontal direction that intersects both the vertical direction and the latching-force-acting direction.

5. The cover-equipped electronic device according to claim 1,
wherein the restraining guide has a restraining oblong hole and a restraining projection, the restraining oblong hole being provided in one of the cover and the device body, the restraining projection being provided on an other of the cover and the device body, the restraining oblong hole being elongated in the latching-force-acting direction; and
wherein the restraining projection is configured to move in the restraining oblong hole such that the cover is guided in the latching-force-acting direction while being restrained in a vertical direction from moving away from the device body, and while being further restrained in a horizontal direction that intersects both the vertical direction and the latching-force-acting direction.

6. The cover-equipped electronic device according to claim 5,
wherein a press-contact guide is provided between the device body and the cover, and is configured to cause the device body and the cover to be pressed into contact with each other when the cover is pressed against the device body in the direction intersecting the latching-force-acting direction, to cause the restraining projection to be inserted into an introduction opening that is continuous with the restraining oblong hole; and
wherein while the cover that is kept in contact with the device body at the press-contact guide is being moved in the latching-force-acting direction, restraint and guiding by the restraining guide is started.

7. The cover-equipped electronic device according to claim 5,
wherein while the cover is being guided in the latching-force-acting direction with the restraining projection moving in the restraining oblong hole, the cover is guided to a position close to the device body where the projecting latch faces the receiving hole or the receiving recess, to be able to latch into the receiving hole or the receiving recess.

8. The cover-equipped electronic device according to claim 1,
wherein the device body is to be installed on a ceiling of a cabin of a vehicle and includes a display screen and an attaching mechanism, the display screen being provided at a front face of the device body, the attaching mechanism being provided at a back face of the device body and allowing the device body to be attached to the vehicle, the attaching mechanism being covered by the cover.

* * * * *